United States Patent [19]

Seher et al.

[11] Patent Number: 5,515,410

[45] Date of Patent: May 7, 1996

[54] IRRADIATION DEVICE FOR DEEP X-RAY LITHOGRAPHY

[75] Inventors: Bernd Seher, Jena; Rudi Neuland, Schoeten; Frank Reuther, Jena, all of Germany

[73] Assignee: Jenoptik Technologie GmbH, Jena, Germany

[21] Appl. No.: 388,978

[22] Filed: Feb. 15, 1995

[30] Foreign Application Priority Data

May 28, 1994 [DE] Germany .......................... 44 18 779.3

[51] Int. Cl.⁶ .................................................... G21K 5/00
[52] U.S. Cl. ................................................ 378/34; 378/208
[58] Field of Search ............................... 378/34, 35, 205, 378/208, 123, 121, 140

[56] References Cited

U.S. PATENT DOCUMENTS

| 4,888,488 | 12/1989 | Miyake | 378/34 |
| 5,134,640 | 7/1992 | Hirokawa et al. | 378/34 |

FOREIGN PATENT DOCUMENTS

3740561A1  7/1988  Germany .

*Primary Examiner*—David P. Porta
*Assistant Examiner*—Don Wong
*Attorney, Agent, or Firm*—McAulay Fisher Nissen Goldberg & Kiel

[57] ABSTRACT

In an irradiation device for deep x-ray lithography the adjustment precision necessary for the irradiation is to be ensured and influences, which act uncontrolled on the adjusted position, substantially eliminated. An object stand is provided which is surrounded by a vacuum chamber, secured to a carrier and is movable with positioning means with respect to a beam and which has a holder suitable not only to receive an article to be irradiated but also to receive an adjusting element. Between the carrier, object stand and positioning means on the one hand and the vacuum chamber on the other hand there is a first isolating, flexible connection and between wall elements, of which one is connected to the carrier and the other is fixed to the frame, there is a second isolating, flexible connection, the surfaces of the two isolating, flexible connections acting against the external air pressure being of the same size. The vacuum chamber and a space defined by the wall elements with the second flexible connection are coupled together for pressure balancing. Such irradiation devices are usable for manufacturing technical microsystem components in accordance with a technology which has become known under the name LIEA process (Lithography with Synchrotron Radiation, Galvano shaping Forming Technology with Plastics).

7 Claims, 3 Drawing Sheets

IRRADIATION DEVICE FOR DEEP X-RAY LITHOGRAPHY

BACKGROUND OF THE INVENTION a) Field of the Invention

The invention relates to an irradiation device for deep x-ray lithography which includes a carrier in a first vacuum chamber for an object stand for receiving an article to be irradiated as the object to be held and for positioning means for moving the object stand with respect to a beam.

b) Description of the Related Art

Such irradiation devices are usable for manufacturing technical microsystem components in accordance with a technology (LIGA process, Microelectron. Eng. 4 (1986), 35–56) which has become known under the name LIGA process (Lithography with Synchrotron Radiation, Galvanoshaping Forming Technology with Plastics).

In the deep x-ray lithography step of this process, a resist layer is directly illuminated with synchrotron radiation via an x-ray mask, the x-ray mask and the resist layer applied to a substrate being secured for this purpose to an object stand which is movable relative to the beam of the synchrotron radiation.

Exposure to x-rays under selectable pressure conditions, which are altered with respect to the surroundings, or differing gas atmospheres presents particular requirements as regards the adjustment and the maintenance of the adjusted position of the x-ray mask and resist with respect to the beam of the synchrotron radiation.

In particular, the uncontrolled effect of a deformation of a chamber wall, which surrounds the object stand and within which atmospheric working conditions prevail, must be excluded.

OBJECT AND SUMMARY OF THE INVENTION

It is thus the primary object of the invention to ensure the adjustment precision necessary for such irradiation with a small expenditure of energy and substantially to exclude influences, such as altered atmospheric working conditions, which have an uncontrolled effect on the adjusted position.

The object is achieved in accordance with the invention by an irradiation device for deep x-ray lithography which includes a carrier in a first vacuum chamber for an object stand for receiving an article to be irradiated as the object to be held and for positioning means to move the object stand with respect to a beam. The object stand has a mounting suitable also for receiving an adjusting element as the object to be held in replacement for the article to be irradiated, provided between the carrier, which is positioned together with the object stand and the positioning means for adjustment with respect to the beam on adjusting means of a frame, and the vacuum chamber, which is connected to the frame. There is a first isolating, flexible connection. Between wall elements, of which the one wall element is connected to the carrier and the other wall element is connected to the frame, there is a second insulating, flexible connection. The surfaces of the two insulating, flexible connections acting against the external air pressure being of the same size. The vacuum chamber and a space defined by the wall elements with the second isolating, flexible connection are coupled together for pressure balancing.

Due to the replaceability of the x-ray mask and resist by an adjusting element, adjustments can be made with very little effort for the most simple case in which there is an air environment within the vacuum chamber. Atmospheric working conditions altered with respect to the external environment permit the state of adjustment which is produced to be uninfluenced by the "de-coupling" of the carrier, object stand and positioning means on the one hand and the vacuum chamber on the other hand and the prevention of a force acting on the carrier directed into the vacuum chamber.

The holder provided for the object stand has, on a base body, a support for the object to be held and a thrust ring secured against rotation to the base body which leaves a channel towards the base body, in which a loop spring surrounding the object to be held is inserted, and of whose walls the wall defined by the thrust ring is inclined to a lesser extent to the object than the other wall of the channel. The base body and the thrust ring, which are both provided with oppositely handed screwthreads on their external diameters, are surrounded by a screw ring engaging in the screwthread to alter the space in the channel available to the loop spring.

Within the irradiation phases, the object to be held advantageously comprises an x-ray mask and a resist and within adjustment phases, an adjustment element.

It is advantageous if the adjustment element includes metal blocks, which are mounted on a base plate and act as end blocks and which leave gaps with a horizontal extent and a vertical extent, adjacent to which on the side of the exit of the radiation there are successively a transparent carrier with a fluorescent layer and detectors.

It is also advantageous if the base plate has bores or openings for the complete measurement evaluation of the beam.

On the basis of fluorescent light and adjustable slits, which are produced by end blocks, the adjustment is effected with reference to the radiation intensity passing through the slits in that, for example, a setting is made to full radiation power with the adjustment means on the frame. As a result of the thickness of the end blocks used with respect to the gap breadth which is produced, it is also ensured that when the object stand is positioned obliquely, the light impinges on the surfaces within the slits defined by the end blocks and thus the full radiation power cannot reach the detectors.

The invention will be explained in more detail below with reference to the schematic drawings, in which:

DESCRIPTION OF THE PREFERRED EMBODIMENTS

Figure 1:
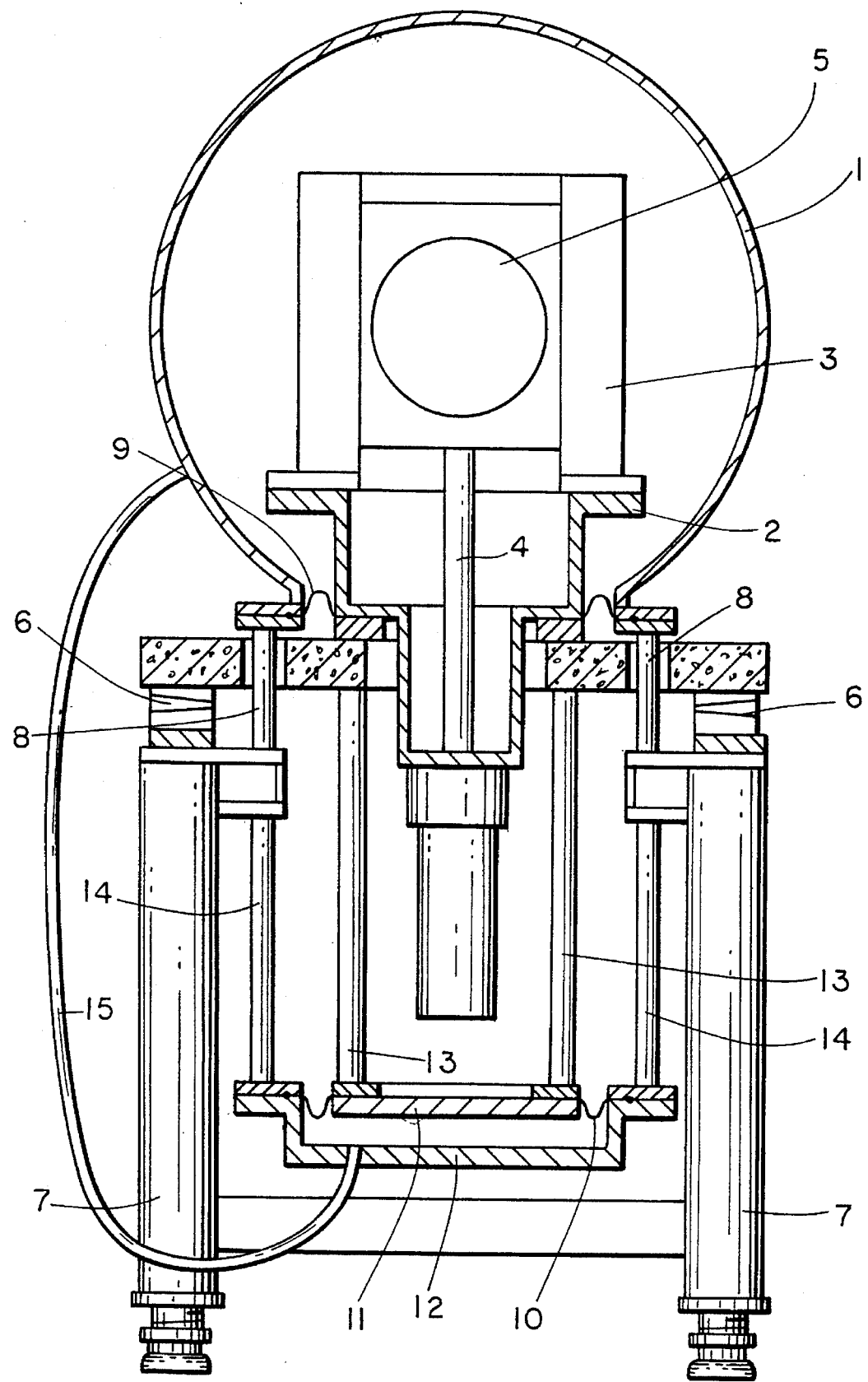
FIG. 1 shows a device in accordance with the invention, partly in section.

As shown in FIG. 1, a vacuum chamber I contains a carrier 2 for an object stand 3 and positioning means 4 for moving the object stand 3 in the vertical direction with respect to a beam, which is not shown, of synchrotron radiation. A circle 5 marks the location at which an object to be irradiated in the form of a mask and resist is secured with a mounting, which is shown in FIG. 2 and which will be described in more detail below.

The carrier 2 is positioned together with the object stand 3 and the positioning means 4 on adjusting means 6 which are connected to a frame 7 which is vertically movable to adapt to beams exiting at different heights. In order to prevent the uncontrolled influence of deformations of the vacuum chamber 1, which is coupled to the frame 7 via columns 8, on the adjusted state of the device, particularly of the alignment of the object stand 3 with respect to the beam, the carrier 2 together with the object stand 3 and the positioning means 4 is mechanically decoupled from the vacuum chamber 1 such that there is merely a first isolating flexible connection in the form of a rubber membrane 9 which permits sufficient movement of the carrier 2, the object stand 3 and of the positioning means 4 and ensures the maintenance of predetermined atmospheric conditions within the vacuum chamber 1.

A second isolating, flexible connection, constructed as a rubber membrane 10, is present between two wall elements 11, 12, of which the wall element 11 is connected to the carrier 2 via columns 13 and the wall element 12 is connected to the frame 7 via columns 14. The space enclosed by the wall elements 11, 12 and the rubber membrane 10 is coupled by a connecting hose 15 to the vacuum chamber 1. If the internal pressure in the vacuum chamber 1 is varied, the same pressure conditions are produced in the space so that forces of equal magnitude act on the carrier 2 and the wall element 11 and a force acting on the carrier 2 directed into the vacuum chamber 1 is prevented. The necessary condition for this is that the surfaces of the rubber membranes 9 and 10 acting against the external air pressure are of the same size.

Figure 2:
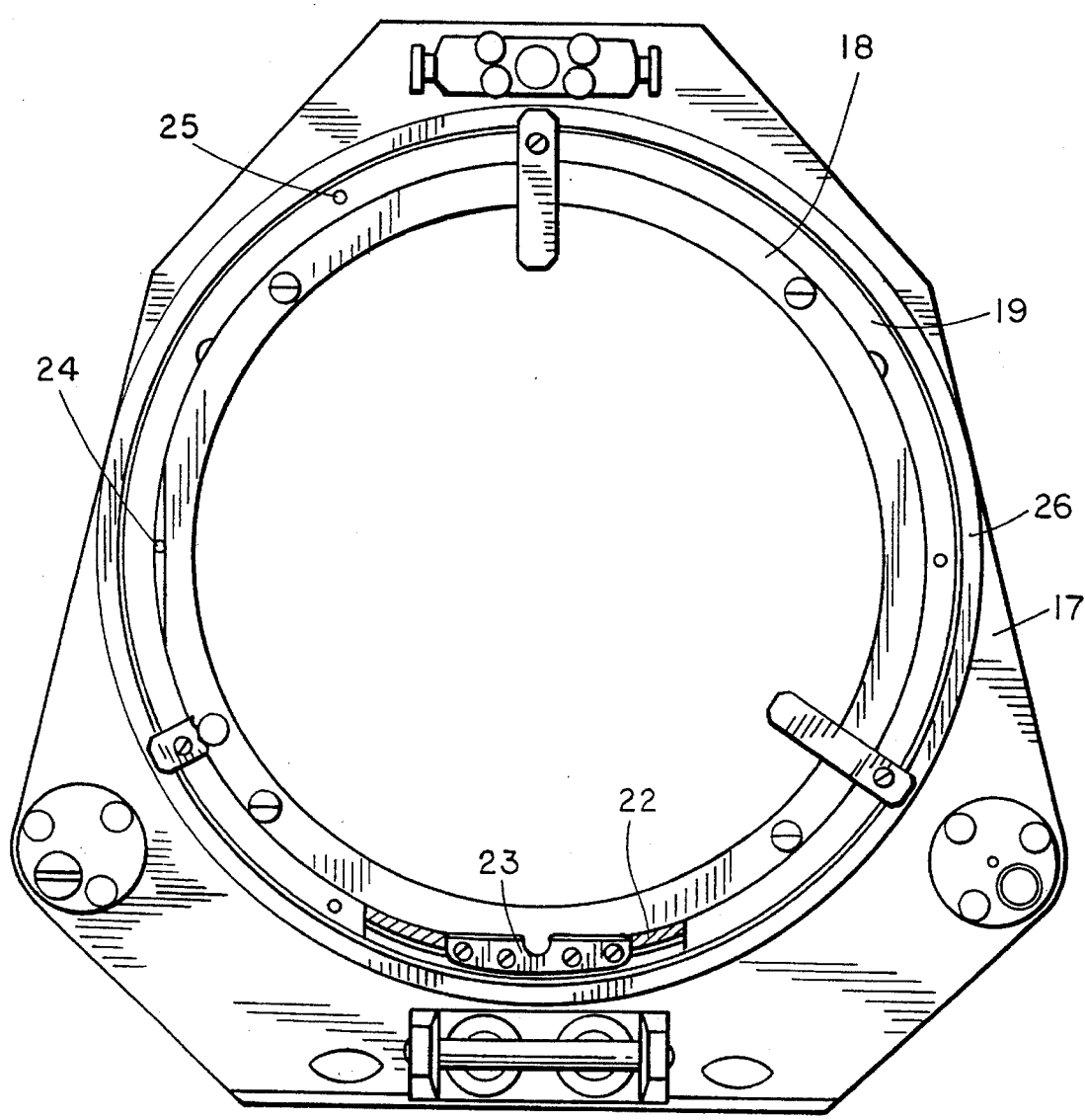
FIG. 2 is a front view of a mounting for receiving not only an article to be irradiated but also an adjusting element.
Figure 3:
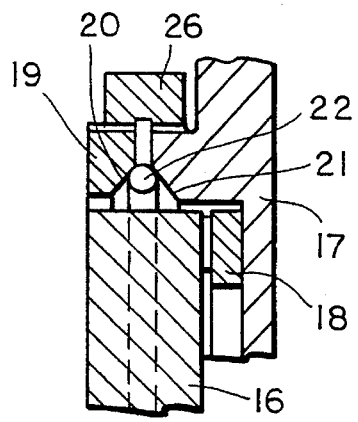
FIG. 3 shows a segment of the mounting with the object unclamped.
Figure 4:
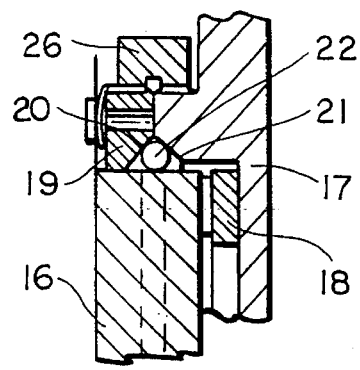
FIG. 4 shows a segment of the mounting with the object clamped.

A mounting illustrated in FIGS. 2, 3 and 4, which is suitable not only for receiving the mask and resist but also adjusting elements as the object 16 to be held with a substantially circular external periphery comprises a base body 17 with a support 18 into which the object 16 to be held is inserted.

A thrust ring 19 defines, together with the base body 17, a wedge-shaped channel, having walls 20, 21. The wall 20 afforded by the thrust ring 19 is inclined to the object 16 to a smaller extent than the wall 21. Inserted into the channel is a loop spring 22 which extends over the entire periphery with the exception of engagement points 23, 24 for a phase and a further engagement point of the object 16 to be held.

The base body 17 and the thrust ring 19, which is secured against rotation to the base body 17 by a pinned fitting 25, have oppositely handed threads on their outer diameters. A screw ring 26 surrounds the base body 17 and the thrust ring 19 with a matching internal thread.

A change of spacing between the base body 17 and the thrust ring 19, produced by rotation of the screw ring 26, results in a narrowing of the channel and thus a deformation of the loop spring 22 so that the inserted object 16 to be held is clamped over its periphery by the uniform application of force. Due to the particular geometrical shaping of the channel, a force acting in the direction of the support 18 is simultaneously produced so that the object 16 is held securely.

The mechanisms 23, 24 in conjunction with the phase and the engagement point on the object 16 serve to ensure a desired position when inserting and clamping the object 16.

Figure 5:
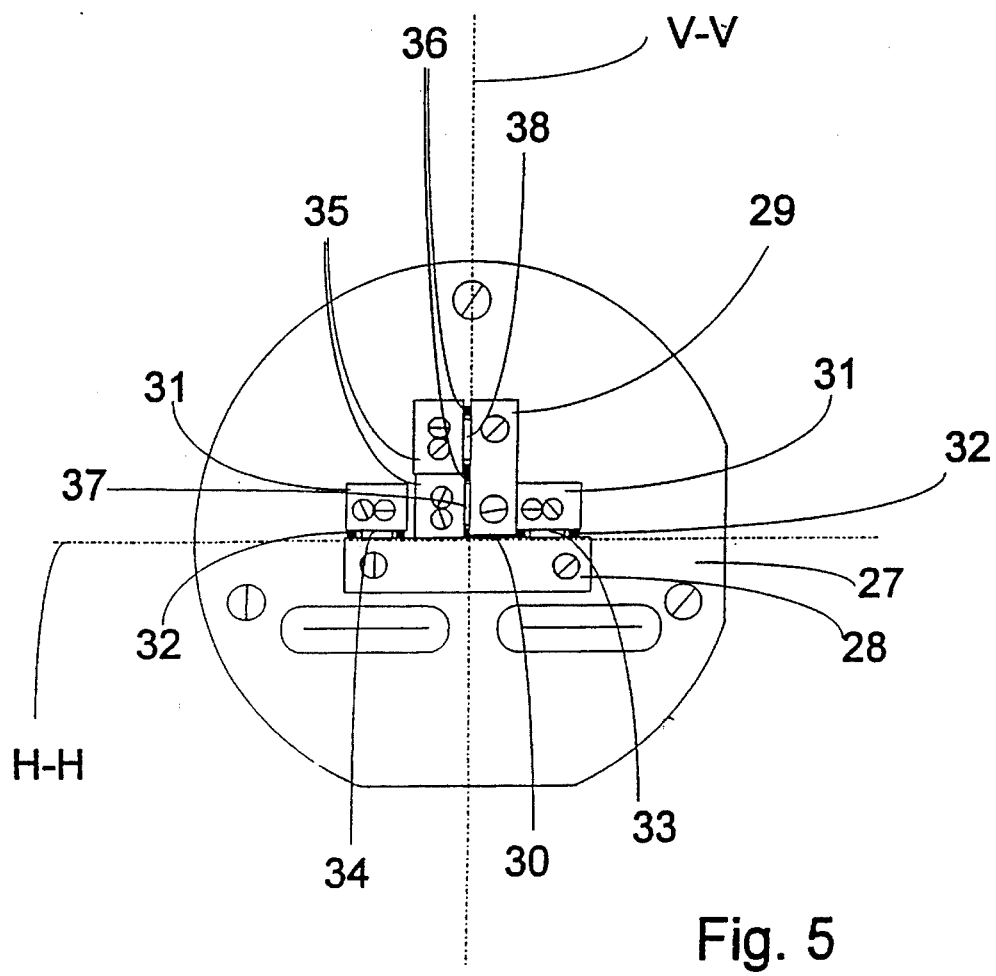
FIG. 5 is a plan view of the adjustment element.
Figure 6:
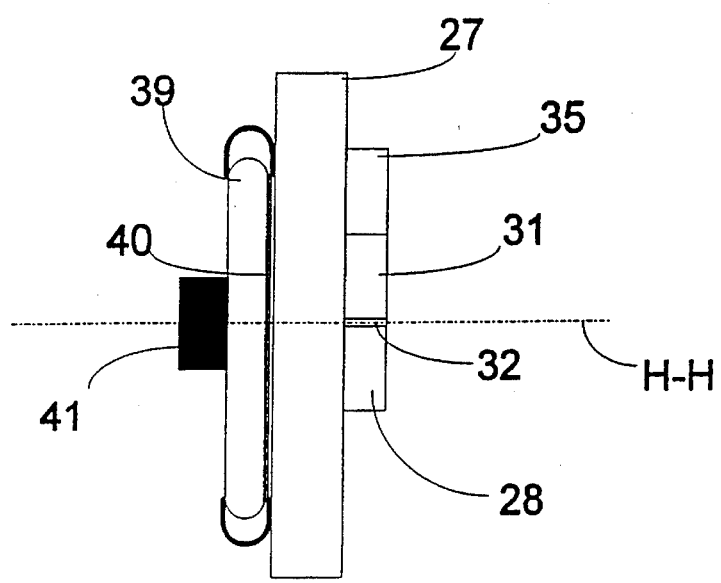
FIG. 6 is a side view of the adjusting element.

FIGS. 5 and 6 show an adjusting means with which the object stand 3 can be aligned in its angular position with respect to the beam about two mutually perpendicular axes and which is of the same external shape as the mask and resist so that fastening in the mounting as shown in FIGS. 2 to 4 is possible. Screwed to a base plate 27 are metal blocks 28, 29, which act as end blocks and which define a vertical reference plane V—V and a horizontal reference plane H—H and between which a first gap 30 with a horizontal extent is defined. Further metal blocks 31 produce, in conjunction with films 32, whose thickness may be selected, with the metal block 28 further gaps 33, 34 with a horizontal extent and metal blocks 35 in conjunction with films 36 of differing thickness produce gaps 37, 38 with a vertical extent with the metal block 29.

The gaps 30, 33, 34, 37 and 38 are aligned perpendicular to the base plate 27 and have predetermined gap breadths.

Furthermore, secured to the base plate 27 is a transparent carrier in the form of a lead glass disc which is provided on its surface directed towards the beam with a fluorescent layer 40 for converting x-rays into fluorescent radiation with a visible wavelength. Regarding detectors, which are arranged on the surface of the lead glass plate 39 directed away from the beam and which serve to detect the fluorescent light, only one detector, designated 41, is shown.

Due to the construction of the gaps 30, 33, 34, 37 and 38 the fluorescent radiation impinging on the receiver is dependent in its intensity on the angular position of the base plate 27 and, since the latter is oriented in a predetermined manner with respect to the object stand 3, also on the object stand 3 to be adjusted. There is thus a maximum intensity for the adjusted state which is set with the adjusting means 6, which are shown in FIG. 1 and are disposed outside the vacuum chamber 1.

Differing gap breadths serve for coarse and fine 25 adjustment, whereby a vertical orientation to the plane H—H can be set with the gaps 30, 33 and 34 and to the plane V—V with the gaps 37 and 38.

In order to be able to make an evaluation within a limited horizontal region of the beam in its entire vertical extent, the base plate 27 can be provided with bores or openings so that the entire cross-section of the beam may be analyzed at these positions.

While the foregoing description and drawings represent the preferred embodiments of the present invention, it will be obvious to those skilled in the art that various changes and modifications may be made therein without departing from the true spirit and scope of the present invention.

What is claimed is:

1. In an irradiation device for deep x-ray lithography which includes a carrier in a first vacuum chamber for an object stand for receiving an article to be irradiated as the object to be held and positioning means to move the object stand with respect to a beam, the improvement comprising:

said object stand having a mounting suitable also for receiving an adjusting element as the object to be held in replacement for the article to be irradiated;

said carrier being positioned together with the object stand and the positioning means for adjustment with respect to the beam on adjusting means of a frame supporting the device;

said vacuum chamber being connected to said frame;

a first isolating, flexible connection being provided between said carrier and said vacuum chamber;

wall elements, one wall element being connected to said carrier and the other wall element being connected to the frame;

a second isolating, flexible connection being arranged between said wall elements;

surfaces of said two insulating, flexible connections acting against the external air pressure being of the same size; and said vacuum chamber and a space defined by said wall elements with the second isolating, flexible connection being coupled together by air duct means for pressure balancing.

2. The irradiation device as claimed in claim 1, wherein the mounting has a support on a base body for the object to be held and a thrust ring, which is secured against rotation to the base body and which leaves a channel towards the base body, in which a loop spring surrounding the object to be held is inserted, and of whose walls the wall defined by the thrust ring is inclined to a lesser extent to the object and the other wall of the channel, and wherein the base body and the thrust ring, which are both provided with oppositely handed screwthreads on their external diameters, are surrounded by a screw ring engaging in the screwthread to alter the space in the channel available to the loop spring.

3. The irradiation device as claimed in claim 2, wherein, within irradiation phases, the object to be held comprises a mask and a resist.

4. The irradiation device as claimed in claim 2, wherein, within adjustment phases, the object to be held is an adjusting means.

5. The irradiation device as claimed in claim 4, wherein the adjusting element includes metal blocks, which are mounted on a base plate and act as end blocks and which leave gaps with a horizontal extent and a vertical extent and adjacent to which on the side of the exit of the radiation there are successively a transparent carrier with a fluorescent layer and detectors.

6. The irradiation device as claimed in claim 5, wherein said gaps, with differing gap breadths, are present for coarse and fine adjustment.

7. The irradiation device as claimed in claim 5, wherein said base plate has bores or openings for the complete measurement evaluation of the beam.

* * * * *